(12) United States Patent
Hilbert (10) Patent No.: US 6,377,504 B1
(45) Date of Patent: Apr. 23, 2002

(54) HIGH-DENSITY MEMORY UTILIZING MULTIPLEXERS TO REDUCE BIT LINE PITCH CONSTRAINTS

(75) Inventor: Mark Francis Hilbert, Naperville, IL (US)

(73) Assignee: Tachuon Semiconductor Corp, Naperville, IL (US)

( * ) Notice: Subject to any disclaimer, the term of this patent is extended or adjusted under 35 U.S.C. 154(b) by 0 days.

(21) Appl. No.: 09/735,336

(22) Filed: Dec. 12, 2000

(51) Int. Cl.$^7$ ................................................ G11C 8/00
(52) U.S. Cl. ........................ 365/230.03; 365/189.02; 365/230.02; 365/207; 365/230.06
(58) Field of Search ................... 365/230.03, 189.02, 365/230.02, 230.06, 207, 140, 51; 709/247

(56) References Cited

U.S. PATENT DOCUMENTS

| | | | | |
|---|---|---|---|---|
| 5,999,985 A | * | 12/1999 | Sebestyen | .................... 709/247 |
| 6,137,730 A | * | 10/2000 | Chien | .................... 365/189.02 |
| 6,208,545 B1 | * | 3/2001 | Leedy | .......................... 365/51 |

FOREIGN PATENT DOCUMENTS

| JP | 410255462 A | * | 9/1998 | ......... G11C/11/401 |
|---|---|---|---|---|

OTHER PUBLICATIONS

Sugibayashi, et al—"A 30–ns 256–Mb DRAM with a Multidivided Array Structure"—IEEE Journal of Solid–State Circuits, vol. 28, No. 11, Nov. 1993.

* cited by examiner

Primary Examiner—David Nelms
Assistant Examiner—David Lam
(74) Attorney, Agent, or Firm—Calvin B. Ward (57) ABSTRACT

A memory that includes a plurality of storage blocks. Each block has a plurality of storage cells constructed from a storage element and an isolation transistor. The storage cells in a block are organized as a plurality of rows and column units. Each column unit includes a first bit line and a plurality of the memory cells connected to the first bit line by the isolation transistors in those memory cells. The memory also includes a first multiplexer connected to a plurality of the first bit lines in a first one of the memory blocks, the first multiplexer connecting one of the first bit lines to a first conductor in response to one or more first multiplexer control signals. The first multiplexer is located adjacent to the storage block containing first bit lines connected thereto. The first conductor is connected to a sense amplifier for reading the contents of the storage cells. The sense amplifier may be located adjacent to the first multiplexer or at a remote location relative to the storage block. The memory is particularly adapted for use in stacked memory designs in which the sense amplifiers and control circuitry are located on a different layer from the storage blocks.

13 Claims, 4 Drawing Sheets

HIGH-DENSITY MEMORY UTILIZING MULTIPLEXERS TO REDUCE BIT LINE PITCH CONSTRAINTS

FIELD OF THE INVENTION

The present invention relates to computer memories, and more particularly, high-density memories.

BACKGROUND OF THE INVENTION

To simplify the following discussion, the present invention will be explained in terms of embodiments that utilize DRAM memory cells. However, it will be apparent from the following discussion, that the present invention can be applied to other forms of memories.

A memory typically includes arrays of memory cells that are arranged in blocks. Each block is organized as a plurality of rows and columns. The memory cells in each column are connected to bit lines that must be routed to sense amplifiers to read the contents of the memory cells. Ideally, a number of bit lines would share the same sense amplifier to minimize the amount of chip area that is devoted to sense amplifiers. However, the difference in the minimum spacing requirements for bit lines and metal conductors makes such arrangements difficult to construct.

The memory arrays may be viewed as an x-y array of memory cells. Each memory cell is connected to a bit line that runs in the y-direction. The bit line spacing is determined by the feature size in the memory. In high-density DRAMs constructed with 0.24 micron feature size, there is one bit line every 0.5 microns along the x-direction of the array. These bit lines are typically constructed from polysilicon. Since polysilicon has a high resistivity, the bit lines cannot be used to route the signals long distances; hence, metallic conductors must be used if the bit lines are to be connected to a sense amplifier that is far from the memory block. Unfortunately, metallic conductors can not be constructed on 0.5 micron centers. In addition, the connection between the bit lines and the metallic conductors would require a vertically running via. The minimum via size is considerably larger than the thickness of the smallest metal lines. Hence, there is a fundamental mismatch between the pitch of the bit lines and the best available pitch of the conductors needed for routing the bit lines to a shared sense amplifier.

Prior art DRAM designs overcome this pitch mismatch by providing one sense amplifier for each pair of bit lines. In these designs, the bit lines are grouped in adjacent pairs, and one sense amplifier is constructed at the end of each bit line pair. To provide sufficient room for all of the sense amplifiers, every other bit line pair exits the memory block from the opposite side of the block. That is, the first pair exits the block from the top and is connected to a sense amplifier adjacent to the top of the array. The next pair exits the block from the bottom of the array and is connected to a sense amplifier adjacent to the bottom of the array, and so on. The output of the sense amplifiers is then routed to another area of the chip via a metal line. However, since there is only one metal line per pair of bit lines, the pitch mismatch discussed above is avoided.

The price of avoiding the pitch mismatch, however, is quite large. The area devoted to sense amplifiers can be as high as 20% of the area of the chip. In addition, the limited area provided for each sense amplifier limits the accuracy and noise immunity of the sense amplifiers.

It should also be noted that the present solution to the pitch mismatch will eventually fail as the feature size is reduced further. The present solution fails if the pitch mismatch exceeds a factor of 2. The size of the memory cells and bit lines will decrease with decreasing feature size. However, the size of the metallic conductors and vias will not necessarily decrease as fast. For example, the minimum diameter of a via depends on the thickness of the insulating layer in which the via is cut. The layer thickness depends on the required insulating characteristics of the material. These parameters do not change with feature size reductions.

Broadly, it is the object of the present invention to provide an improved memory design, which avoids the problems associated with pitch mismatch discussed above.

It is a further object of the present invention to provide a memory design that scales with the feature size used in constructing the memory.

These and other objects of the present invention will become apparent to those skilled in the art from the following detailed description of the invention and the accompanying drawings.

SUMMARY OF THE INVENTION

The present invention is a memory that includes a plurality of storage blocks. Each block has a plurality of storage cells constructed from a storage element and an isolation transistor. The storage cells in a block are organized as a plurality of rows and column units. Each column unit includes a first bit line and a plurality of the memory cells connected to the first bit line by the isolation transistors in those memory cells. The memory also includes a first multiplexer connected to a plurality of the first bit lines in a first one of the memory blocks, the first multiplexer connecting one of the first bit lines to a first conductor in response to one or more first multiplexer control signals. The first multiplexer is located adjacent to the storage block containing first bit lines connected thereto. In some embodiments of the invention, each column unit further includes a second bit line and a plurality of the memory cells connected to the second bit line by the isolation transistors in those memory cells. In these cases, the memory also includes a second conductor and a second multiplexer connected to a plurality of the second bit lines in the first one of the memory blocks. The second multiplexer connects one of the second bit lines to the second conductor in response to one or more second multiplexer control signals such that the second multiplexer connects the second bit line in a given column unit to the second conductor when the first multiplexer connects the first bit line in that column unit to the first vertical conductor. In the preferred embodiment of the present invention, the first and second conductors are shared by multiplexers from different memory blocks. The first and second conductors are connected to a sense amplifier for reading the contents of the storage cells. The sense amplifier may be located adjacent to the first multiplexer or at a remote location.

DETAILED DESCRIPTION OF THE INVENTION

Figure 1:
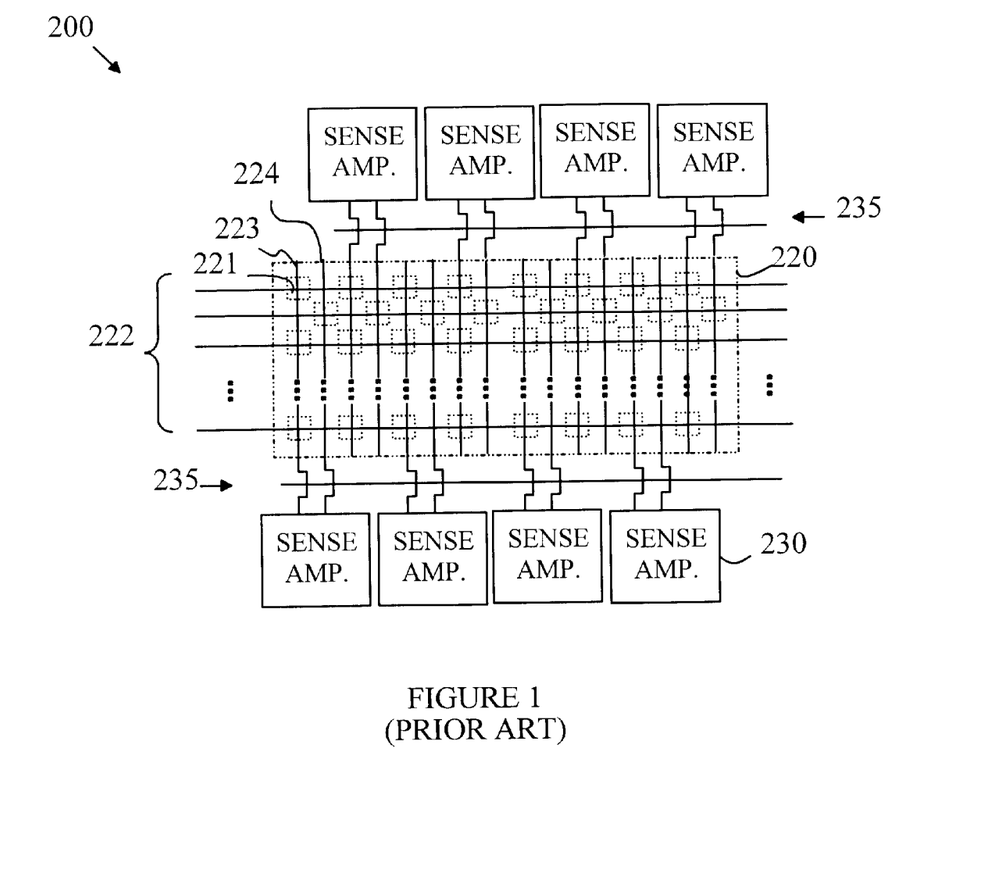
FIG. 1 is a schematic drawing of one block of a prior art DRAM memory 200 and the sense amplifiers associated therewith.

The manner in which the present invention provides its advantages may be more easily understood with reference to FIG. 1, which is a schematic drawing of one block of a prior art DRAM memory 200 and the sense amplifiers associated therewith. The memory is divided into memory blocks. An exemplary memory block is shown at 220. Each memory block includes a two-dimensional array of memory cells such as memory cell 221. Each array is organized as a plurality of rows and columns. All of the memory cells in a row are connected to a word line 222, which is shared by a large number of the memory blocks in memory 200. When the word line is asserted, all of the memory cells on that word line are connected to the bit lines that run over the memory cells. To simplify the drawings, the bit lines have been shown as "lines"; however, it is to be understood that each bit line is actually a strip of polysilicon that has a finite width. The lines represent the centers of these strips.

In DRAMs, the memory block may be viewed as being constructed from column units consisting of two adjacent columns. There are two bit lines associated with each column unit of memory cells. These bit lines are referred to as B and B' in the following discussion. An exemplary B bit line is shown at 223 and an exemplary B' bit line is shown at 224.

When the memory is read, both the B and B' lines are precharged; however, only one of these lines is actually connected to a memory cell. The row of memory cells that is connected to the bit lines is selected by a logic signal on a word line 222. If the memory cell is connected to a B bit line, the B' bit line acts as a reference, and vice versa. That is, the B and B' bit lines are both connected to the same sense amplifier. An exemplary sense amplifier is shown at 230. For the purposes of this discussion, assume that the B bit line is connected to the "+" input of the sense amplifier and the B' bit line is connected to the "−" input of the sense amplifier. If the memory cell is connected to the B bit line, the sense amplifier output will indicate the stored Logic State. If, however, the memory cell is connected to the B' bit line, the sense amplifier output will indicate the complement of the stored logic state. The bit line that acts as a reference allows differential sensing, which helps in eliminating data errors.

The memory cells on the B bit lines are offset vertically from those on the B' bit lines. Hence, any word line will only activate a B or a B' column. This offset arrangement also facilitates a more dense packaging arrangement of the memory cells in a block.

The output from each sense amplifier is routed to a column decoder by a corresponding overhead metal conductor from the column decoder. To simplify the drawing, these metal lines have been omitted. Since only one such metal conductor is needed for each pair of bit lines, this pitch is acceptable. As noted above, to provide room for the sense amplifiers, alternate pairs of bit lines are extended from different sides of the array.

To reduce the area occupied by sense amplifiers, the sense amplifiers are normally shared between adjacent memory blocks. To prevent the capacitance of the bit lines in the non-selected memory block from interfering with the sensing of the bit lines in the selected memory block, decoupling transistors 235 are provided between the bit lines and the sense amplifiers.

Figure 2:
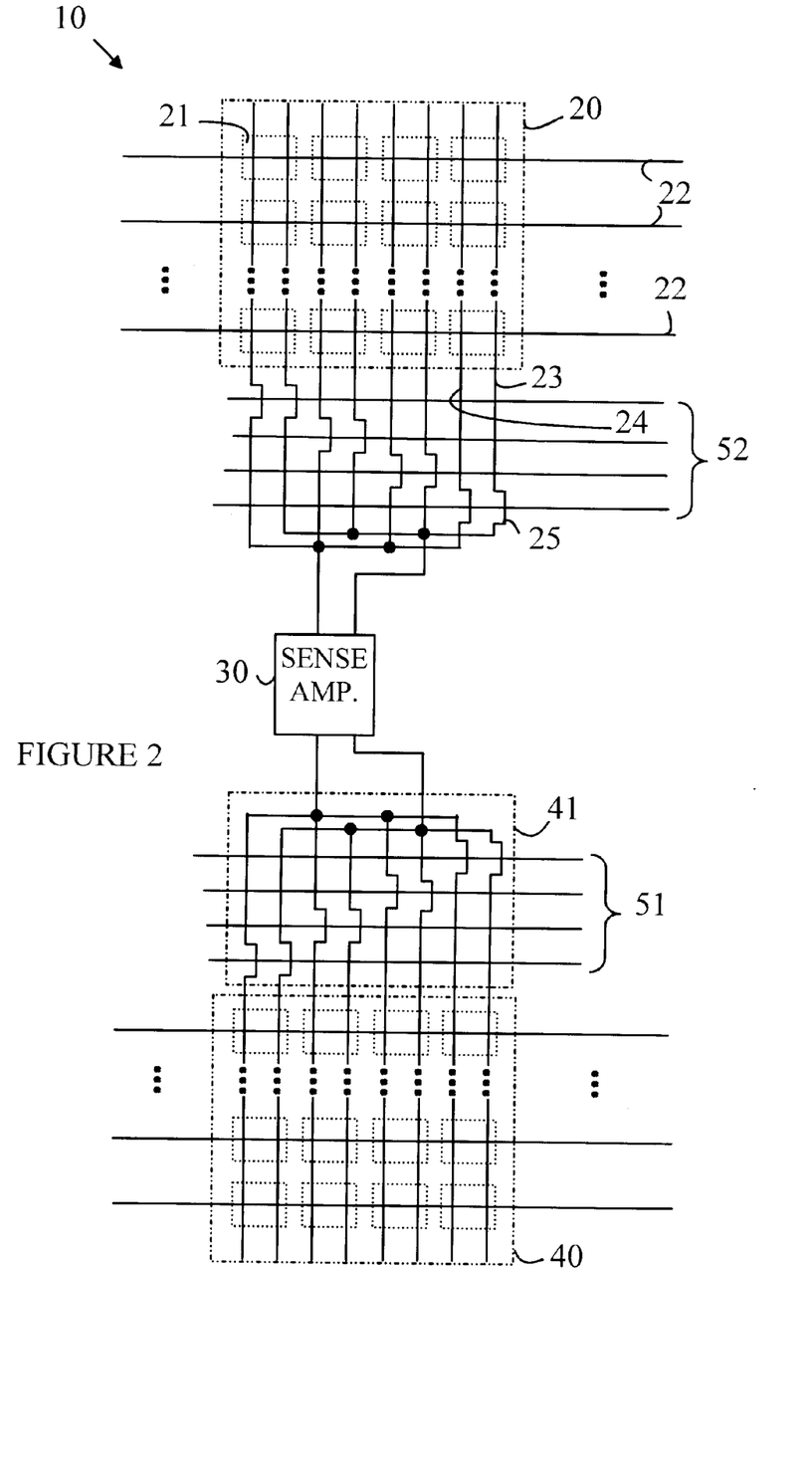
FIG. 2 is a top schematic view of a portion of a memory layer 10 according to the present invention.

The manner in which the present invention overcomes the pitch mismatch can be more easily understood with reference to FIG. 2, which is a top schematic view of a portion of a memory 10 according to the present invention. The memory is similar to the prior art DRAM shown in FIG. 1 in that the memory is divided into memory blocks. Exemplary memory blocks are shown at 20 and 40. Each memory block includes a two-dimensional array of memory cells such as memory cell 21. Each array is organized as a plurality of rows and columns. All of the memory cells in a row are connected to a word line 22, which is shared by a large number of the memory blocks in memory 10. When the word line is asserted, all of the memory cells on that word line are connected to the bit lines that run over the memory cells. To simplify the drawings, the bit lines have been shown as "lines"; however, it is to be understood that each bit line is actually a strip of polysilicon that has a finite width.

To simplify the following discussion, it will again be assumed that the memory blocks are constructed from DRAM cells. However, it will be obvious to those skilled in the art from the following discussion that the teachings of the present invention may be applied to a number of different memory cell types. As noted above, in DRAMs, the memory block may be viewed as being constructed from column units consisting of two adjacent columns. An exemplary B bit line is shown at 23 and an exemplary B' bit line is shown at 24.

In the embodiment of the present invention shown in FIG. 2, the pitch mismatch is overcome by utilizing one sense amplifier for each 4 pairs of bit lines in a memory block. In addition, two memory blocks also share each sense amplifier, thereby further reducing the number of sense amplifiers needed.

This sharing of sense amplifiers is enabled by utilizing multiplexers such as multiplexer 41. In the embodiment shown in FIG. 2, one such multiplexer is associated with each group of 4 bit line pairs exiting the bottom of the memory block. Similarly, one such multiplexer is associated with each group of 4 bit line pairs exiting the top of the memory block. The multiplexers are constructed from the same type of transistors that are used to construct the memory cells, and hence, can be constructed in the memory fabrication technology without introducing new fabrication steps. The importance of this feature of the present invention will be discussed in more detail below. An exemplary multiplexer transistor is shown at 25. To simplify the drawing, the remaining transistors have not been labeled. In principle, the multiplexer transistors can be constructed from transistors that have the same width as those in the memory cells. In this case, the multiplexer transistors can be constructed at the same pitch as the bit lines and only one layer of multiplexers would be needed for each memory block. For example, the multiplexer on the top of the memory block could be moved to the bottom of the memory block without increasing the space devoted to multiplexers. Unfortunately, the design rules for the transistors outside of the memory blocks tend to be more conservative than the rules governing the transistors within the memory blocks. Hence, in the preferred embodiment of the present invention, it is assumed that the multiplexer transistors must be wider than the bit line spacing. Accordingly, the alternate bit line architecture of the conventional DRAM blocks is maintained, which allows transistors that are twice as wide as those used in the memory cells to be utilized in the multiplexers. The multiplexer transistors are controlled by two groups of 4 routing signal lines that are shown at 51 and 52. These routing lines can be shared by a number of memory blocks.

When a memory cell in block 20 is read or written, the corresponding B and B' lines for that cell are connected to the corresponding sense amplifier. Consider the case in which the memory cells are conventional DRAM memory cells. To read the data in any given memory cell, the data in the memory cells that share the same word line and sense amplifier must also be sensed and re-written. When the word line is selected, each of the memory cells connected to that word line is partially discharged to the associated B and B' bit lines. Hence, all 4 memory cells associated with a sense amplifier will be connected to the bit lines shared by the sense amplifier at the same time. Since the memory cell has lost charge to a bit line, it must be refreshed, i.e., sensed and re-written to restore the full logic levels. In the preferred embodiment of the present invention, this operation is performed as follows. First, all bit line pairs in the memory array are precharged to a reference potential from precharge devices on the array side of the bit line multiplexers with all of the multiplexer transistors turned off. The word line is then energized and three of the four multiplexer transistors are placed in the non-conducting state. The bit line pair connected to the remaining transistors are then routed to the sense amplifier and read and the corresponding memory cell refreshed. The transistors associated with this bit line pair are then placed in the non-conducting state, and the next bit line pair is selected by placing the corresponding multiplexer transistors in the conducting state and placing the remaining multiplexer transistors in the non-conducting state. The value stored in the corresponding memory cell will already be on the bit line and the corresponding reference bit line will have been charged to the correct potential. Hence, the sense amplifier need only sense the value on the bit line pair and write back the data to complete the refresh of this memory cell. The process is continued until all of the bit lines pairs associated with a sense amplifier have been read and the corresponding memory cells refreshed.

The optimum number of bit lines from a memory block that can share a sense amplifier depends on a number of factors. Denote the number of bit line pairs sharing a single sense amplifier by N. As N increases, the fraction of the chip devoted to sense amplifiers decreases. However, once the fraction of the chip devoted to sense amplifiers becomes a small fraction of the chip area, further reductions will not substantially reduce the cost of the chip. In general, the more bit lines that share a sense amplifier, the longer the refresh cycle time, since these lines must be refreshed serially. Hence, N is a trade-off between refresh speed and chip area devoted to sense amplifiers.

In addition, if a single transistor is used for each multiplexed line, the multiplexer will add 2N transistors to the length of each column in the memory block because a multiplexer of size N must be added on each side of the memory block. Typical memory blocks have 128 memory cells per column, each of which being approximately one transistor long. Hence, a 4-line multiplexer adds only 6 percent to the size of the memory block.

It should be noted, however, that the extra area required by the multiplexer will be offset by the reduced complexity and area required for the address decoder. A memory stores and retrieves data with reference to an address that is decoded to select a particular bit line and word line for each bit of the word to be stored or retrieved. Somewhere in the system, an address decoder exists that decodes an address to generate a signal on a particular word line and to select a particular bit line. Usually, part of the address is decoded to select the bit line and the remainder is decoded to provide the word line. The multiplexer of the present invention decodes the last two bits of the column address. As a result, the remaining part of the address decode circuitry is simplified, and hence, requires less silicon area. For example, when applying this invention to a DRAM architecture that is compatible with existing DRAMS, the number of columns is increased by a factor of 4. The 4:1 multiplexer decodes the last two bits of the column portion of the address. The remainder of the column decode circuitry is the same as the old column decoder. However, since the number of columns have increased by a factor of 4, the number of rows needed for a given size memory decreases by a factor of 4. As a result, the row decoder needs to decode 2 less bits, and hence, is smaller than the row decoder needed before increasing the number of columns.

It should also be noted that the rows of transistors shown at 235 in FIG. 1 are no longer needed, since the transistors in the multiplexers can provide this decoupling function. Hence, the area needed by the sense amplifiers and associated circuitry is further reduced in the present invention.

The above-described embodiments of the present invention utilize conventional memory blocks such as those utilized in DRAM memories. However, the present invention can also be practiced with other forms of memory blocks such as those based on SRAM or EEPROM technologies. In general, each of these storage cells has a storage element and one or more isolation transistors for connecting the storage element to one or more bit lines, respectively. In the case of SRAMs, each memory cell is connected to two bit lines; hence, a column unit would consist of a single column of storage cells.

In addition, the present invention can be practiced with multilevel memories in which the "bit lines" carry analog signals that represent values having more than two states. Two such memory designs are described in U.S. patent application Ser. No. 09/417,040, filed Oct. 12, 1999 and U.S. patent application Ser. No. 09/476,625, filed Dec. 13, 1999, which are hereby incorporated by reference. In these embodiments, the sense amplifiers include analog-to-digital converters for reading the data stored in the memory cells and digital-analog-converters that generate the analog values stored in the memory cells.

Figure 3:
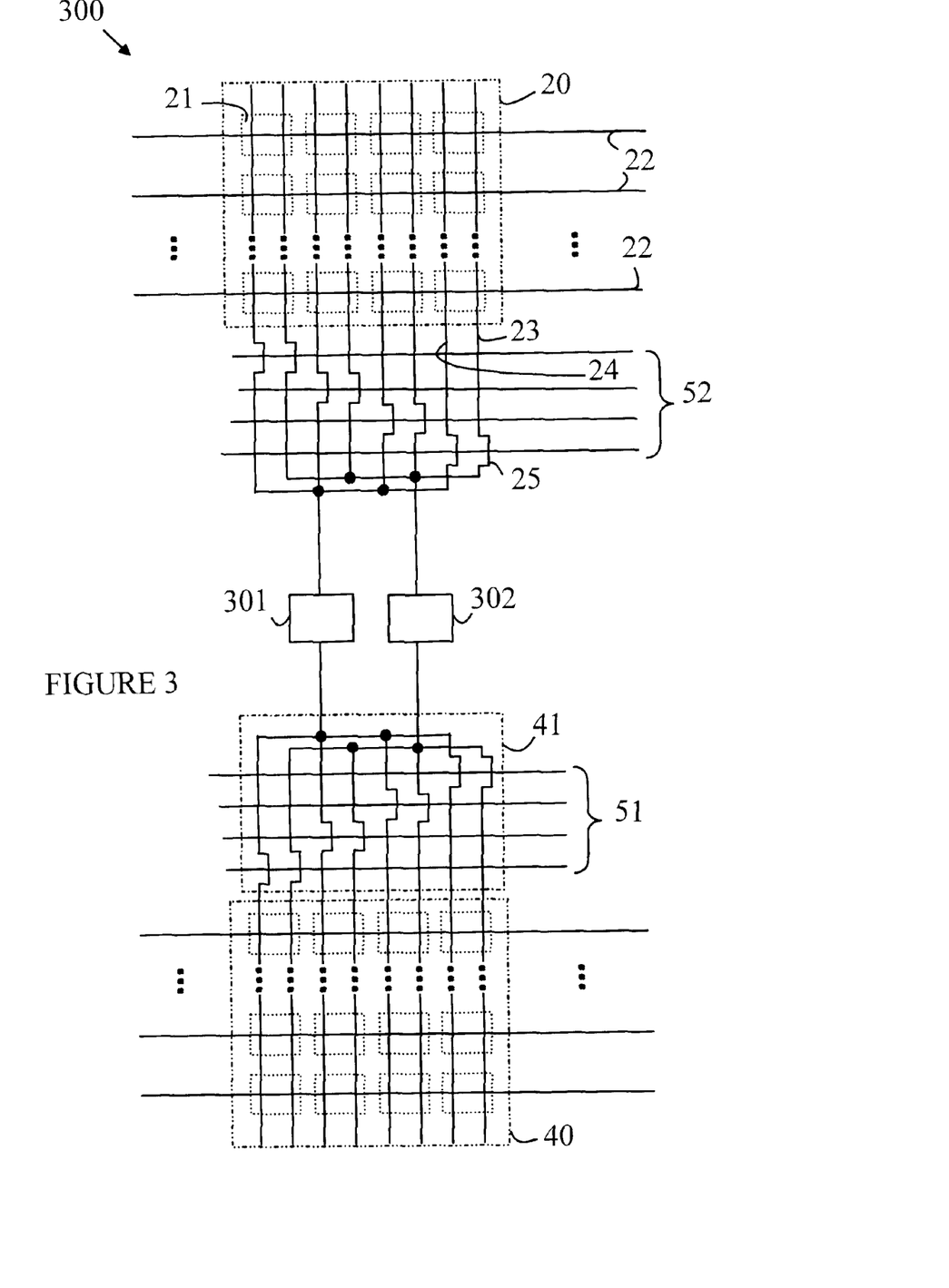
FIG. 3 is a schematic drawing of a portion of a memory 300 that utilizes a sense amplifier arrangement in which the sense amplifiers are located some distance away from the memory blocks they service.

The above-described embodiments of the present invention utilize an arrangement in which the sense amplifiers are located next to the memory blocks that they service. However, the present invention can be utilized in systems in which the sense amplifiers are remotely located. Refer now to FIG. 3, which is a schematic drawing of a portion of a memory 300 that utilizes a sense amplifier arrangement in which the sense amplifiers are located some distance away from the memory blocks they service. To simplify the following discussion, those elements of memory 300 that serve the same function as elements shown in FIG. 2 have been given the same numeric designations. Memory 300 differs from memory 10 in that the sense amplifier has been replaced by two pads 301 and 302 that are used to make connections to metallic conductors that run over the memory blocks. Since each conductor services a number of bit lines, the pitch problem discussed above is avoided. To reduce problems associated with noise, the metallic conductors preferably run parallel to one another between the pads and the sense amplifier.

It should be noted that the sense amplifiers could be located on the same chip as the memory blocks that it services or on another chip. Modem integrated circuits are typically constructed in a thin layer in a semiconducting layer on a substrate wafer such as silicon. This essentially two-dimensional structure limits both the size of the integrated circuit and the speed at which the circuit operates. The speed at which an integrated circuit operates is determined by the distance between the farthest separated components that must communicate with one another on the chip. For any given number of components, the path lengths will, in general, be significantly reduced if the circuit can be laid out as a three dimensional structure consisting of a number of vertically-stacked layers of circuitry, provided the vertical distances between the layers are much smaller than the width of the chips that make up the individual layers.

One promising scheme for providing such stacked structures utilizes a wafer-bonding scheme. In this method, integrated circuits are fabricated on conventional wafers. Two wafers are bonded vertically by thinning one wafer in a first coarse thinning operation by removing material from the back of the wafer. The circuitry on the front surface of each wafer is covered with an insulating layer having metal filled vias that make contact with the underlying circuitry and act as electrical connection points between the two wafers. The front surfaces of the wafers are then placed in contact with one another and bonded via thermal diffusion bonding. One of the wafers is then further thinned to a thickness of a few microns by etching or mechanically grinding the back surface of that wafer. Once the wafer has been thinned, a new set of vias is opened in the backside and filled with metal to provide the connection points for adding yet another wafer to the stack as well as connections to circuitry on the front side of the wafer. The process is then repeated until the desired number of layers has been bonded to form the three-dimensional stack. The three-dimensional stack is then cut into three-dimensional chips and packaged.

Stacked DRAM memories are particularly attractive because stacking permits the separation of the memory into a control layer and a number of memory layers. The control layer includes the various decode circuits and sense amplifiers. The memory layers contain the actual storage cell arrays. The memory layers can be constructed utilizing semiconductor processing techniques that are significantly less expensive than those utilized to construct the circuitry in the control layer, and hence, the cost per bit of stacked DRAM is potentially much less than that of a conventional two-dimensional DRAM.

A memory layer includes arrays of memory cells that are connected to bit lines that must be routed to sense amplifiers on the control layer via vertical conductors that pass through the stacked memory layers utilizing some of the vias discussed above. The vias in one layer are connected to those in an adjacent layer through pads that also act as bonding pads for bonding the two layers together. The minimum size of the vias is determined by the thickness of the layers, as there is a maximum aspect ratio for such vias. The thickness of the layers, in turn, is determined by mechanical considerations. For example, the layers must be thick enough to withstand the mechanical polishing used in the thinning process. Hence, there is a minimum via diameter of the order of one micron. As a result, two vias cannot be constructed closer than 2–3 microns.

As noted above, the bit line spacing is determined by the feature size in the memory. Memories constructed with 0.24 micron feature sizes have one bit line pair per micron of space perpendicular to the bit line direction. Since the maximum density of vias is one per 4–6 microns, the bit lines cannot be directly routed to the controller by a via for each bit line. That is, there is a pitch mismatch between the bit lines and the vertical conductors used to route the signals to the sense amplifiers.

Figure 4:
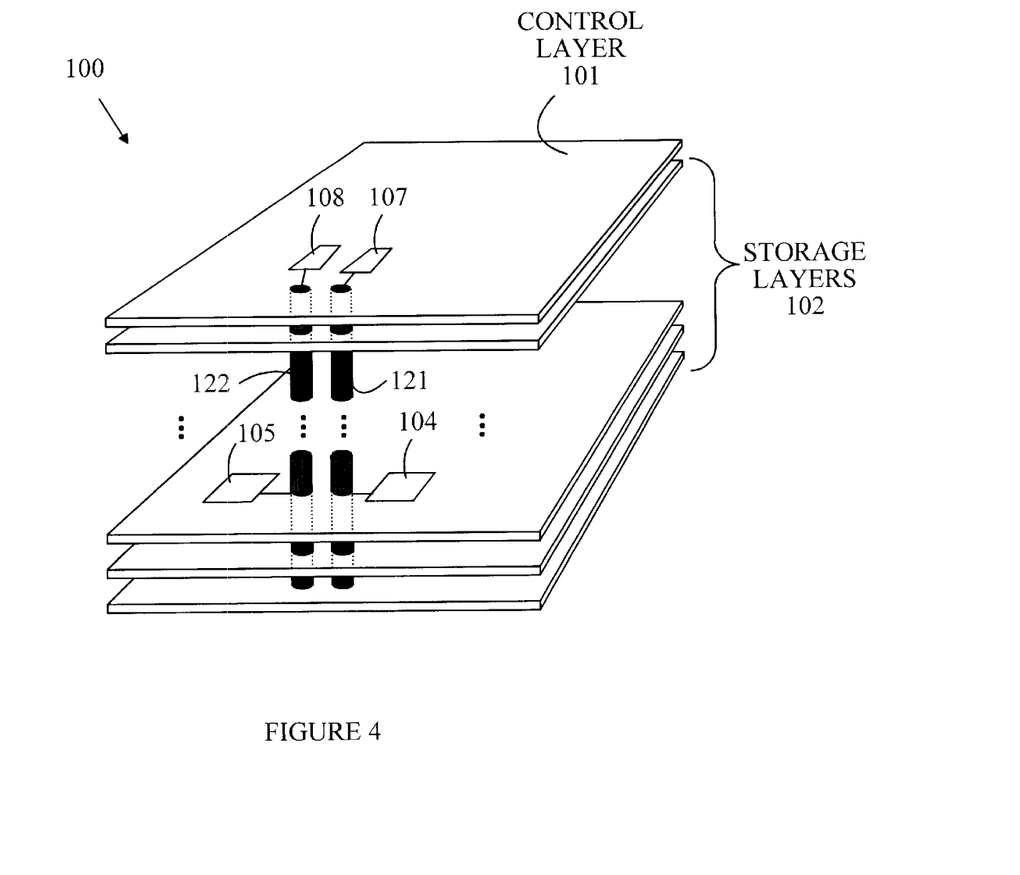
FIG. 4 is a schematic perspective view of a stacked memory 100 according to the present invention.

Refer now to FIG. 4, which is a schematic perspective view of a stacked memory 100 according to the present invention. Memory 100 is constructed from a control layer 101 and a plurality of storage layers 102. Control layer 101 contains the sense amplifiers 107 and 108 and other control circuitry for reading and writing storage cells in the memory blocks such as blocks 104 and 105 that are contained on the various storage layers. The connections between the various storage layers and the control layer are provided by vertical conductors that pass through vias in the various storage layers and control layer. Exemplary vertical conductors are shown at 121 and 122. The vertical conductors are constructed by filling the vias with a high conductivity metal such as copper. The copper filled vias have resistivities that are a small fraction of the resistivities of the polysilicon conductors that provide the bit lines that connect the storage cells to the vertical conductors, Additionally, the three-dimensional nature of the stack allows for shorter interconnections associated with the sense amplifiers. As a result, the cycle time of the memory is substantially shorter. Unfortunately, as noted above, the vertical conductors are considerably larger in diameter than the polysilicon bit lines; hence, there is a mismatch in pitch, i.e., the distance between successive lines in the direction perpendicular to the lines, between the bit lines and the vertical conductors.

The embodiment of the present invention shown in FIG. 3 is used to overcome the pitch mismatch between the vertical conductors and the bit lines. Since each group of bit lines shares the same connection pads, the pitch mismatch is avoided, since only one pad is needed per group of 8 bit lines. In addition, the higher speed of the stacked memory offsets the increased time needed to refresh the memory in the case of a stacked DRAM memory.

Various modifications to the present invention will become apparent to those skilled in the art from the foregoing description and accompanying drawings. Accordingly, the present invention is to be limited solely by the scope of the following claims.

What is claimed is:

1. A stacked memory comprising a control layer and one or more storage layers, each storage layer comprising:
  a plurality of storage blocks, each block comprising a plurality of storage cells, each storage cell comprising a storage element and an isolation transistor, said storage cells being organized as a plurality of rows and column units, each column unit comprising a first bit line and a plurality of said memory cells connected to said first bit line by said isolation transistors in those memory cells;
  a first vertical conductor; and
  a first multiplexer connected to a plurality of said first bit lines in a first one of said memory blocks, said first multiplexer connecting one of said first bit lines to said first vertical conductor in response to one or more first multiplexer control signals.

2. The stacked memory of claim 1 wherein said first vertical conductor is connected to said control layer.

3. The stacked memory of claim 1 wherein each column unit further comprises a second bit line and a plurality of said memory cells connected to said second bit line by said isolation transistors in those memory cells, and wherein said stacked memory further comprises a second vertical conductor and a second multiplexer connected to a plurality of said second bit lines in said first one of said memory blocks, said second multiplexer connecting one of said second bit lines to said second vertical conductor in response to one or more second multiplexer control signals.

4. The stacked memory of claim 3 wherein said first and second multiplexer signals are generated on said control layer.

5. The stacked memory of claim 3 wherein said first and second vertical conductors connect said storage layer to said control layer and wherein said first and second vertical conductors are maintained in proximate relationship to one another between said storage layer and said control layer.

6. A stacked memory comprising a control layer and one or more storage layers, each storage layer comprising:
 a plurality of storage blocks, each block comprising a plurality of storage cells, each storage cell comprising a storage element and an isolation transistor, said storage cells being organized as a plurality of rows and column units, each column unit comprising a first bit line and a plurality of said memory cells connected to said first bit line by said isolation transistors in those memory cells;
 a first vertical conductor; and
 a first multiplexer connected to a plurality of said first bit lines in a first one of said memory blocks, said first multiplexer connecting one of said first bit lines to said first vertical conductor in response to one or more first multiplexer control signals, wherein each column unit further comprises a second bit line and a plurality of said memory cells connected to said second bit line by said isolation transistors in those memory cells, wherein said stacked memory further comprises a second vertical conductor and a second multiplexer connected to a plurality of said second bit lines in said first one of said memory blocks, said second multiplexer connecting one of said second bit lines to said second vertical conductor in response to one or more second multiplexer control signals, and
 wherein said second multiplexer connects said second bit line in a given column unit to said second vertical conductor when said first multiplexer connects said first bit line in that column unit to said first vertical conductor.

7. A stacked memory comprising a control layer and one or more storage layers, each storage layer comprising:
 a plurality of storage blocks, each block comprising a plurality of storage cells, each storage cell comprising a storage element and an isolation transistor, said storage cells being organized as a plurality of rows and column units, each column unit comprising a first bit line and a plurality of said memory cells connected to said first bit line by said isolation transistors in those memory cells;
 a first vertical conductor;
 a first multilexer connected to a plurality of said first bit line in a first one of said memory blocks, said first multiplexer connecting one of said first bit lines to said first vertical conductor in response to one or more first multiplexer control signals; and
 a third multiplexer, said third multiplexer being connected to a plurality of said first bit lines in a second one of said storage blocks, said third multiplexer connecting one of said first bit lines to a predetermined one of said first or second vertical conductors in response to one or more third multiplexer control signals.

8. A memory circuit comprising:
 a plurality of storage blocks, each block comprising a plurality of storage cells, each storage cell comprising a storage element and an isolation transistor, said storage cells being organized as a plurality of rows and column units, each column unit comprising a first bit line and a plurality of said memory cells connected to said first bit line by said isolation transistors in those memory cells;
 a first conductor; and
 a first multiplexer connected to a plurality of said first bit lines in a first one of said storage blocks, said first multiplexer connecting one of said first bit lines to said first conductor in response to one or more first multiplexer control signals, said first multiplexer being located adjacent to said first one of said storage blocks, wherein each column unit further comprises a second bit line and a plurality of said memory cells connected to said second bit line by said isolation transistors in those memory cells, wherein said memory circuit further comprises a second conductor and a second multiplexer connected to a plurality of said second bit lines in said first one of said memory blocks, said second multiplexer connecting one of said second bit lines to said second conductor in response to one or more second multiplexer control signals, and
 wherein said second multiplexer connects said second bit line in a given column unit to said second conductor when said first multiplexer connects said first bit line in that column unit to said first conductor.

9. A memory circuit comprising:
 a plurality of storage blocks, each block comprising a plurality of storage cells, each storage cell comprising a storage element and an isolation transistor, said storage cells being organized as a plurality of rows and column units, each column unit comprising a first bit line and a plurality of said memory cells connected to said first bit line by said isolation transistors in those memory cells;
 a first conductor;
 a first multiplexer connected to a plurality of said first bit lines in a first one of said storage blocks, said first multiplexer connecting one of said first bit lines to said first conductor in response to one or more first multiplexer control signals, said first multiplexer being located adjacent to said first one of said storage blocks; and
 a third multiplexer, said third multiplexer being connected to a plurality of said first bit lines in a second one of said storage blocks, said third multiplexer connecting one of said first bit lines to a predetermined one of said first or second conductors in response to one or more third multiplexer control signals.

10. A memory circuit comprising:
 a plurality of storage blocks, each block comprising a plurality of storage cells, each storage cell comprising a storage element and an isolation transistor, said storage cells being organized as a plurality of rows and column units, each column unit comprising a first bit line and a plurality of said memory cells connected to said first bit line by said isolation transistors in those memory cells;
 a first conductor;
 a first multiplexer connected to a plurality of said first bit lines in a first one of said storage blocks, said first multiplexer connecting one of said first bit lines to said first conductor in response to one or more first multiplexer control signals, said first multiplexer being located adjacent to said first one of said storage blocks; and a sense amplifier for reading data stored in said storage cells, said sense amplifier being connected to said first conductor.

11. The memory circuit of claim 10 wherein said sense amplifier is located adjacent to said first multiplexer.

12. A method for operating a memory circuit comprising a plurality of storage blocks, each block comprising a plurality of storage cells, each storage cell comprising a storage element and an isolation transistor, said storage cells being organized as a plurality of rows and column units, each column unit comprising a first bit line and a plurality of said memory cells connected to said first bit line by said isolation transistors in those memory cells; a first conductor; and a first multiplexer connected to a plurality of said first bit lines in a first one of said memory blocks, said first multiplexer connecting one of said first bit lines to said first conductor in response to one or more first multiplexer control signals, said method comprising the steps of:

simultaneously connecting each of said first bit lines connected to said first multiplexer to said first conductor while said first conductor is at a precharge potential;

sequentially connecting each of said first bit lines to said first conductor while isolating said remaining first bit lines; and measuring the voltage or current passing through said first conductor when that first bit line is connected to said first conductor.

13. The method of claim 12 further comprising the step of placing a voltage on said first conductor, or causing a current to flow through said first conductor, said voltage or current being determined by said measured voltage or current, respectively.

* * * * *

UNITED STATES PATENT AND TRADEMARK OFFICE
CERTIFICATE OF CORRECTION

PATENT NO.   : 6,377,504 B1
DATED        : April 23, 2002
INVENTOR(S)  : Hilbert It is certified that error appears in the above-identified patent and that said Letters Patent is hereby corrected as shown below:

<u>Title page,</u>
Item [73], Assignee, delete "Tachuon" and insert -- Tachyon --

<u>Column 6,</u>
Line 39, delete "Dec. 13" and insert -- Dec. 31 --

<u>Column 9,</u>
Line 55, delete "line" at beginning of line and insert -- lines --

Signed and Sealed this

Third Day of September, 2002

*Attest:*

*Attesting Officer*

JAMES E. ROGAN
*Director of the United States Patent and Trademark Office*